US007969214B2

(12) United States Patent
Jang et al.

(10) Patent No.: US 7,969,214 B2
(45) Date of Patent: Jun. 28, 2011

(54) DLL CIRCUIT, UPDATE CONTROL APPARATUS IN DLL CIRCUIT AND UPDATE METHOD OF DLL CIRCUIT

(75) Inventors: Jae Min Jang, Gyeonggi-do (KR); Yong Ju Kim, Gyeonggi-do (KR); Sung Woo Han, Gyeonggi-do (KR); Hee Woong Song, Gyeonggi-do (KR); Ic Su Oh, Gyeonggi-do (KR); Hyung Soo Kim, Gyeonggi-do (KR); Tae Jin Hwang, Gyeonggi-do (KR); Hae Rang Choi, Gyeonggi-do (KR); Ji Wang Lee, Gyeonggi-do (KR); Chang Kun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 50 days.

(21) Appl. No.: 12/493,387

(22) Filed: Jun. 29, 2009

(65) Prior Publication Data

US 2010/0117696 A1 May 13, 2010

(30) Foreign Application Priority Data

Nov. 11, 2008 (KR) ........................ 10-2008-0111478

(51) Int. Cl.
*H03L 7/06* (2006.01)

(52) U.S. Cl. ........................................ 327/158; 327/149

(58) Field of Classification Search .................. 327/149, 327/158
See application file for complete search history.

(56) References Cited

U.S. PATENT DOCUMENTS

| | | | | |
|---|---|---|---|---|
| 6,781,861 | B2 | 8/2004 | Gomm et al. | |
| 6,803,826 | B2 | 10/2004 | Gomm et al. | |
| 7,218,158 | B2 * | 5/2007 | Kim | 327/158 |
| 7,495,487 | B2 * | 2/2009 | Ma et al. | 327/158 |
| 7,746,134 | B1 * | 6/2010 | Lu et al. | 327/158 |
| 7,750,698 | B2 * | 7/2010 | Kim | 327/158 |
| 2008/0042704 | A1 | 2/2008 | Na | |
| 2009/0079481 | A1 * | 3/2009 | Ma | 327/158 |
| 2010/0123495 | A1 * | 5/2010 | Kobayashi et al. | 327/158 |
| 2010/0244916 | A1 * | 9/2010 | Kim | 327/158 |

FOREIGN PATENT DOCUMENTS

| | | | |
|---|---|---|---|
| JP | 2003-101409 | A | 4/2003 |
| JP | 2008-217947 | A | 9/2008 |
| KR | 1020020002565 | A | 1/2002 |

* cited by examiner

*Primary Examiner* — Lincoln Donovan
*Assistant Examiner* — Adam D Houston
(74) *Attorney, Agent, or Firm* — Ladas & Parry LLP

(57) ABSTRACT

A delay locked loop (DLL) circuit includes a phase detection unit configured to generate a phase detection signal by comparing a phase of a reference clock signal with a phase of a feedback clock signal. An update control apparatus is configured to generate a valid interval signal and an update control signal by determining a difference between the number of first logical values and the number of second logical values of the phase detection signal in response to the reference clock signal. A shift register configured to update a delay value granted to a delay line in response to the update control signal when the valid interval signal is enabled.

16 Claims, 2 Drawing Sheets

DLL CIRCUIT, UPDATE CONTROL APPARATUS IN DLL CIRCUIT AND UPDATE METHOD OF DLL CIRCUIT

CROSS-REFERENCES TO RELATED PATENT APPLICATION

The present application claims priority under 35 U.S.C 119(a) to Korean Application No. 10-2008-0111478, filed on Nov. 11, 2008, in the Korean Intellectual Property Office, the disclosure of which is incorporated herein by reference in its entirety as set forth in full.

BACKGROUND

1. Technical Field

The present invention relates generally to semiconductor integrated circuits (IC) and, more particularly, to a delay locked loop (DLL) circuit in a semiconductor IC.

2. Related Art

A conventional DLL circuit included in a semiconductor IC device is used to supply an internal clock signal having a phase earlier than that of a reference clock signal acquired by converting an external clock signal by a predetermined time. When the internal clock signal utilized in the semiconductor IC is delayed through a clock buffer and a transmission line to have a phase difference from the external clock signal, the DLL circuit is used to solve a resultant problem in that an output data access time is extended. The DLL circuit controls a phase of the internal clock signal to be earlier than that of the external clock signal by a predetermined time in order to increase a valid data output interval.

The conventional DLL circuit includes a clock input buffer, a delay line, a shift register, a clock driver, a replica delayer, a phase detector, and an update control apparatus. The phase detector compares a phase of a reference clock signal output from the clock input buffer with a phase of a feedback clock signal output from the replica delayer. The update control apparatus transmits a phase comparison result of the phase detector to the shift register. As the speed of the device increases, the variation of the phase comparison detection result increases, and an abnormal operation may occur. The update control apparatus is provided to prevent the abnormal operation. The update control apparatus accumulates the phase comparison result values. When the accumulated values reach a predetermined value, the update control apparatus controls a delay value that the shift register supplies to the delay line to be updated.

The conventional update control apparatus is implemented using a low pass filter. That is, when the phase comparison detection value maintains the same values for a predetermined number of cycles, the update control apparatus generates and transmits an update control signal to the shift register. However, such an update control apparatus has a complicated update condition. For example, when the update control apparatus operates in response to three consecutive phase comparison detection result values, the update control apparatus may generate a normal update control signal with respect to values (0, 0, 0) or (1, 1, 1), but cannot generate the update control signal when values of (0, 0, 1) is repeated. Subsequently, the update operation using the update control apparatus is ineffective and the DLL circuit with the above update control apparatus is limited in that the update control apparatus cannot accurately control the phase of the internal clock signal.

SUMMARY

Embodiments of the present invention include a delay locked loop (DLL) circuit capable of more accurately controlling a phase of an internal clock signal even during an irregular variation of a phase comparison detection result value, an update control apparatus in the DLL circuit, and an update method of the DLL circuit.

According to one embodiment of the present invention, a delay locked loop (DLL) circuit includes a phase detection unit configured to compare a phase of a reference clock signal with a phase of a feedback clock signal so as to generate a phase detection signal; an update control apparatus configured to generate a valid interval signal and generate an update control signal by determining a difference between the number of first logical values and the number of second logical values of the phase detection signal in response to the reference clock signal; and a shift register configured to update a delay value supplied to a delay line according to the update control signal when the valid interval signal is enabled.

According to another embodiment of the present invention, an update control apparatus in a DLL circuit includes a switching portion configured to selectively output a reference clock signal as one of a first counting control clock signal and a second counting control clock signal according to a phase detection signal; a first counting portion configured to perform a counting operation in response to the first counting control clock signal and generate a first counting signal having one or more bits; a second counting portion configured to perform the counting operation in response to the second counting control clock signal and generate a second counting signal having one or more bits; and an update control portion configured to compare logical values of a bit of the one or more bits of the first counting signal and a bit of the one or more bits of the second counting signal and generate an update control signal according to the compared logical values and the phase detection signal.

In still another embodiment of the present invention, an update method of a DLL circuit includes generating a phase detection signal by comparing a phase of a reference clock signal and a phase of a feedback clock signal; enabling a valid interval signal when a difference between the number of times a logical value of the phase detection signal has a first logical value and the number of times the logical value of the phase detection signal has a second logical value is equal to or exceeds a predetermined number; updating a delay value which a delay line supplies to the reference clock signal in response to the valid interval signal; and disabling the valid interval signal when updating the delay value is completed.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
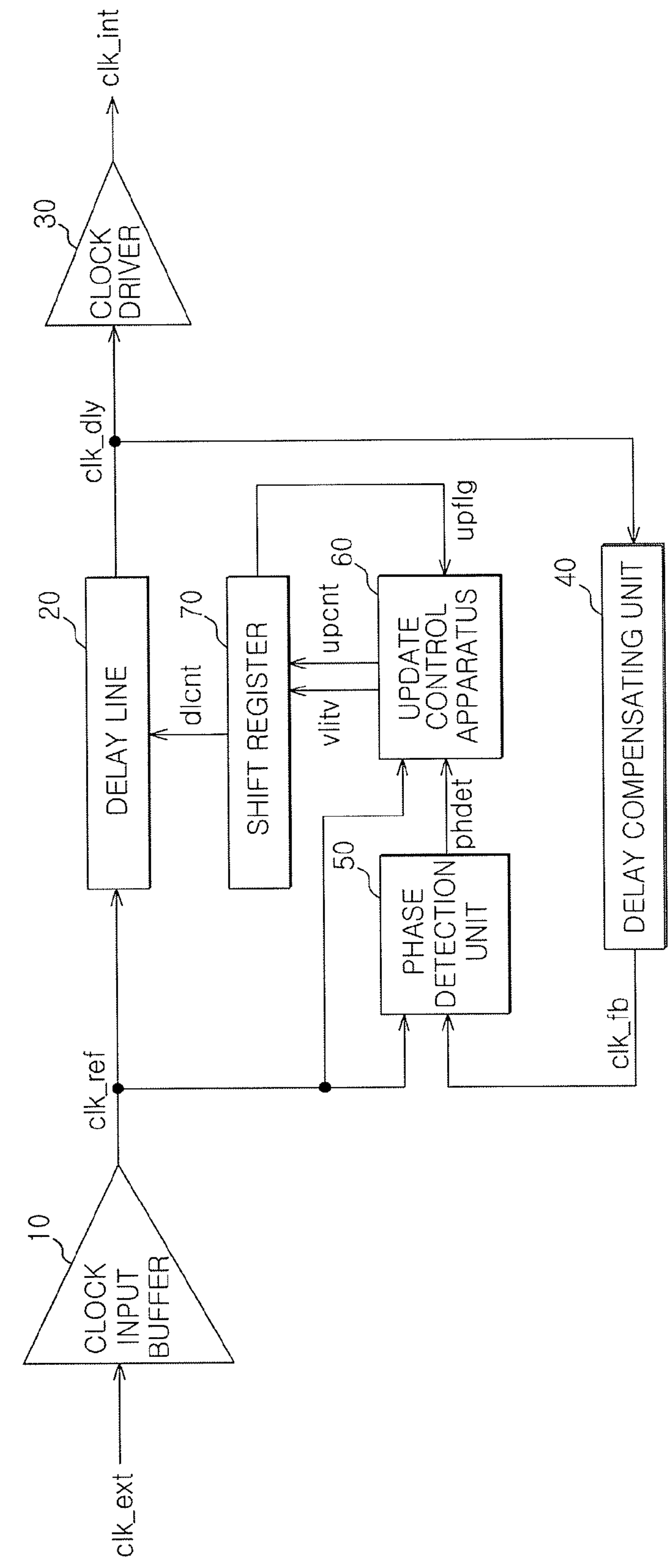
FIG. 1 is a block diagram showing an exemplary DLL circuit according to one embodiment of the present invention.

FIG. 1 is a block diagram of an exemplary DLL circuit according to one embodiment.

As shown in FIG. 1, the DLL circuit according to one embodiment of the present invention can include a clock input buffer 10, a delay line 20, a clock driver 30, a delay compensating unit 40, a phase detecting unit 50, an update control apparatus 60, and a shift register 70.

According to an embodiment of the present as shown in FIG. 1, the clock input buffer 10 generates a reference clock signal 'clk_ref' by buffering an external clock signal 'clk_ext'. The delay line 20 generates a delay clock signal 'clk_dly' by delaying the reference clock signal 'clk_ref' in response to a delay control signal 'dlcnt'. The clock driver 30 generates an internal clock signal 'clk_int' by driving the delay clock signal 'clk_dly'. The delay compensating unit 40 generates a feedback clock signal 'clk_fb' by delaying the delay clock signal 'clk_dly' with a delay value acquired by modeling a delay value generated by delay elements provided on an output path of the delay clock signal 'clk_dly'.

As shown in FIG. 1, the phase detecting unit 50 can generate a phase detection signal 'phdet' by comparing a phase of the feedback clock signal 'clk_fb' with a phase of the reference clock signal 'clk_ref'. The update control apparatus 60 determines a difference between the number of first logical values and the number of second logical values (i.e., the difference between the number of a logical value '0' and a logical value '1') of the phase detection signal 'phdet' to generate a valid interval signal 'vlitv' and an update control signal 'upcnt' in response to the reference clock signal 'clk_ref'. The shift register 70 updates a logical value of the delay control signal 'dlcnt' in response to the update control signal 'upcnt' when the valid interval signal 'vlitv' is enabled.

According to the embodiment of the present invention as shown in FIG. 1, the phase detecting unit 50 can generate the phase detection signal 'phdet' by detecting a level of the feedback clock signal 'clk_fb' at a rising edge of the reference clock signal 'clk_ref'. Accordingly, the phase detection signal 'phdet' is updated at the same frequency as the reference clock signal 'clk_ref'.

Thereafter, the update control apparatus 60 determines the logical value of the phase detection signal 'phdet' at every rising edge of the reference clock signal 'clk_ref' and counts the difference between the number of the first logical value and the number of the second logical value of the phase detection signal 'phdet'. When the number of the first logical values exceeds the number of the second logical values by a predetermined number, or when the number of the second logical values exceeds the number of the first logical values by the predetermined number, the update control apparatus 60 enables the valid interval signal 'vlitv'. Further, in this case the update control apparatus 60 outputs the phase detection signal 'phdet' as the update control signal 'upcnt'.

For example, assuming that the difference between the number of the first logical values and the number of the second logical values of the phase detection signal 'phdet' for enabling the valid interval signal 'vlitv' is set to 16, once the number of first logical values exceeds the number of second logical value by 16, the update control apparatus 60 enables the valid interval signal 'vlitv'. Further, since the logical value of the phase detection signal 'phdet' at the time when the valid interval signal 'vlitv' is enabled is the first logical value, the update control apparatus 60 transmits the phase detection signal 'phdet' having the first logical value to the shift register 70 as the update control signal 'upcnt'.

The shift register 70 can change a logical value of the delay control signal 'dlcnt' in response to the update control signal 'upcnt' transmitted when the valid interval signal 'vlitv' is enabled. The shift register 70 completes changing the logical value of the delay control signal 'dlcnt', and then enables an update flag signal 'upflg'. As such, it will apparent to those skilled in the art that a predetermined circuit component in the semiconductor IC completes a predetermined operation and enables the flag signal.

The update control apparatus 60 disables the valid interval signal 'vlitv' in response to the enabling the update flag signal 'upflg'. The shift register 70 is not influenced by the update control signal 'upcnt' after the valid interval signal 'vlitv' is disabled.

Figure 2:
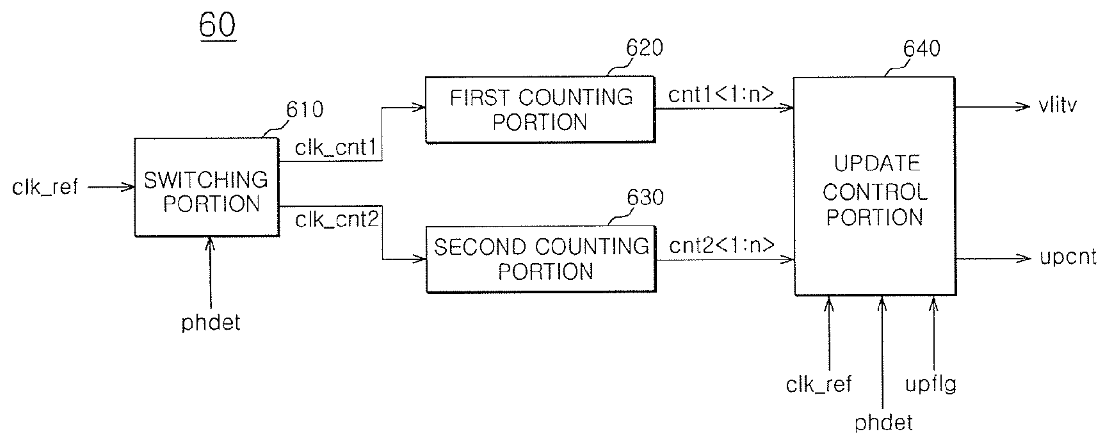
FIG. 2 is a configuration diagram showing an exemplary update control apparatus shown in FIG. 1 according to one embodiment of the present invention.

FIG. 2 is a configuration diagram showing an exemplary update control apparatus of FIG. 1 according to one embodiment of the present invention.

As shown in FIG. 2, according to an embodiment of the present invention the update control apparatus 60 can include a switching portion 610, a first counting portion 620, a second counting portion 630, and an update control portion 640.

The switching portion 610 selectively outputs the reference clock signal 'clk_ref' as one of a first counting control clock signal 'clk_cnt1' and a second counting control clock signal 'clk_cnt2' in response to the phase detection signal 'phdet' input thereto. The first counting portion 620 can generate an n-bit first counting signal 'cnt1<1:n>' by performing a counting operation in response to the first counting control clock signal 'clk_cnt1', where 'n' is a natural number. The second counting portion 630 can generate an n-bit second counting signal 'cnt2<1:n>' by performing the counting operation in response to the second counting control clock signal 'clk_cnt2'. The update control portion 640 compares logical values of each bit between the n-bit first counting signal 'cnt1<1:n>' and the n-bit second counting signal 'cnt2<1:n>' and generates the valid interval signal 'vlitv' and the update control signal 'upcnt' in response to the comparison result of the logical values and the phase detection signal 'phdet'.

The switching portion 610 outputs the reference clock signal 'clk_ref' as one of the first counting control clock signal 'clk_cnt1' and the second counting control clock signal 'clk_cnt2' according to the logical value of the phase detection signal 'phdet'. That is, by way of example, the switching portion 610 can activate the first counting control clock signal 'clk_cnt1' when the phase detection signal 'phdet' has the first logical value and activate the second counting control clock signal 'clk_cnt2' when the phase detection signal 'phdet' has the second logical value.

The first counting portion 620 can increase a logical value of the n-bit first counting signal 'cnt1<1:n>' by performing an up-counting (i.e., incrementing) operation when the first counting control clock signal 'clk_cnt1' is activated. The second counting portion 630 can increase a logical value of the n-bit second counting signal 'cnt2<1:n>' by performing the up-counting (incrementing) operation when the second counting control clock signal 'clk_cnt2' is activated. Accordingly, each of the first counting portion 620 and the second counting portion 630 is implemented by using an up-counter (i.e., a counter that incrementally increases value). The up-counter increases the logical value by each '1' while being activated. When the up-counter increases the logical value by '1' after the logical value reaches the maximum value, the up-counter is configured to continuously perform the counting operation after converting an output value into the minimum value again.

Herein, it is preferable that the n-bit first counting signal 'cnt1<1:n>' and the n-bit second counting signal 'cnt2<1:n>' are initially set to different values from each other. For example, when the number of bits "n" is 5, the n-bit first counting signal 'cnt1<1:n>' can be initially set to (1, 0, 0, 0, 0) and the n-bit second counting signal 'cnt2<1:n>' can be initially set to (0, 0, 0, 0, 0). The update control portion 640 determines whether or not the logical value of the n-bit first counting signal 'cnt1<1:n>' and the logical value of the n-bit second counting signal 'cnt2<1:n>' are equal to each other. When the first counting signal 'cnt1<1:n>' and the second counting signal 'cnt2<1:n>' have equal logical values, it follows that one of the first counting portion 620 and the second counting portion 630 has performed the up-counting operations by 16 times than the other. Therefore, at this time, the update control portion 640 enables the valid interval signal 'vlitv'. It should be understood that while the difference between the number of the first logical values and the number of the second logical values of the phase detection signal 'phdet' for enabling the valid interval signal 'vlitv' is set to 16, the present invention is not limited in this way, rather the number being set to 16 is by way of example only.

The update control portion 640 latches the phase detection signal 'phdet' by using the reference clock signal 'clk_ref'. The update control portion 640 outputs the phase detection signal 'phdet' latched as the update control signal 'upcnt' when each of the first counting signal 'cnt1<1:n>' and the second counting signal 'cnt2<1:n>' are determined to have the same logical value. Since the last value of the phase detection signal 'phdet' input into the update control portion 640 makes the logical values of the first counting signal 'cnt1<1:n>' and the second counting signal 'cnt2<1:n>' equal, it is apparent that the logical value of the phase detection signal 'phdet' at the time is inputted 16 more times than other logical value.

Thereafter, the update control portion 640 disables the valid interval signal 'vlitv' in response to the update flag signal 'upflg' transmitted from the shift register 70.

Figure 3:
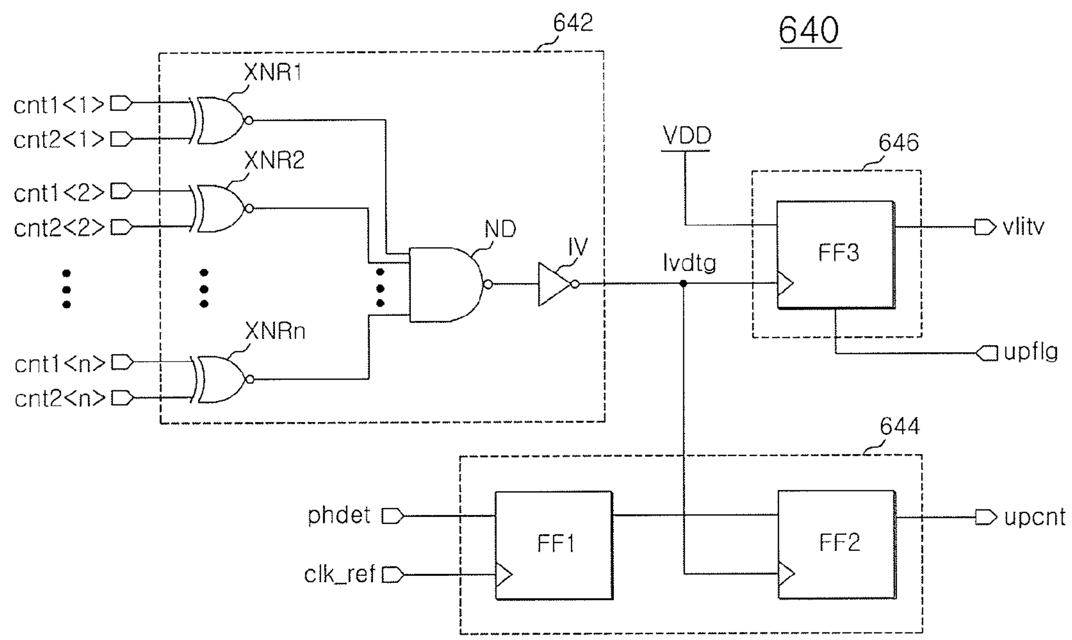
FIG. 3 is a configuration diagram showing an exemplary update control portion shown in FIG. 2 according to one embodiment of the present invention.

FIG. 3 is a configuration diagram showing an exemplary update control portion shown in FIG. 2 according to one embodiment of the present invention.

As shown in the FIG. 3, according to an embodiment of the present invention the update control portion 640 can include a logical value determination section 642, a first latch section 644, and a second latch section 646.

According to an embodiment of the present invention as shown in FIG. 3, the logical value determination section 642 generates a logical value determination signal 'lvdtg' by comparing logical values of each bit between the n-bit first counting signal 'cnt1<1:n>' and the n-bit second counting signal 'cnt2<1:n>'. The logical value determination section 642 can include n exclusive NOR gates XNR1 to XNRn, a NAND gate ND, and an inverter IV.

Each of the n exclusive NOR gates XNR1 to XNRn receives one bit of the n-bit first counting signal 'cnt1<1:n>' and a corresponding bit of the n-bit second counting signal 'cnt2<1:n>'. The NAND gate ND receives output signals of each of the n exclusive NOR gates XNR1 to XNRn. According to an embodiment of the present invention, the inverter IV receives an output signal of the NAND gate ND and outputs the logical value determination signal 'lvdtg'.

The first latch section 644 can latch the phase detection signal 'phdet' in response to the reference clock signal 'clk_ref' and re-latch the latched phase detection signal 'phdet' in response to the logical value determination signal 'lvdtg' to output the update control signal 'upcnt'. As shown in FIG. 3, the first latch section 644 can include a first flip-flop FF1 and a second flip-flop FF2.

According to an embodiment as shown in FIG. 3, the first flip-flop FF1 latches the phase detection signal 'phdet' in response to the reference clock signal 'clk_ref', and the second flip-flop FF2 latches an output signal of the first flip-flop FF1 in response to the logical value determination signal 'lvdtg' to output the update control signal 'upcnt'.

As shown in FIG. 3, the second latch section 646 can latch an external supply voltage VDD in response to the logical value determination signal 'lvdtg' to output the valid interval signal 'vlitv'. The second latch section 646 can include a third flip-flop FF3 that is reset in response to the update flag signal 'upflg', the third flip-flop FF3 latches the external supply voltage VDD in response to the logical value determination signal 'lvdtg' to output the valid interval signal 'vlitv'.

According to the configuration shown in FIG. 3, the logical value determination signal 'lvdtg' is enabled when the n-bit first counting signal 'cnt1<1:n>' and the n-bit second counting signal 'cnt2<1:n>' have the same logical values each other. When the n-bit first counting signal 'cnt1<1:n>' and the n-bit second counting signal 'cnt2<1:n>' have the same logical values the second flip-flop FF2 of the first latch section 644 re-latches the phase detection signal 'phdet' latched in the first flip-flop FF1 and outputs the update control signal 'upcnt'. Further, the third flip-flop FF3 of the second latch section 646 can enable the valid interval signal 'vlitv' by latching the external supply voltage VDD. Thereafter, when the update flag signal 'upflg' is enabled, the third flip-flop FF3 is reset and the valid interval signal 'vlitv' is disabled.

As described above, according to embodiments of the present invention, an update control apparatus in a DLL circuit is configured to determine whether a phase detection signal has more than any one of a first logical value and a second logical value and enable a valid interval signal and an update control signal when a difference between the two logical values reaches a predetermined threshold value. Through this, the DLL circuit according to an embodiment of the present invention operates with an update condition remarkably relaxed in comparison with the related art by accumulating the phase comparison result values and performing an update by using the same. Consequently, the DLL circuit of the present invention performs a more efficient update and more accurately controls a phase of an internal clock signal.

While certain embodiments have been described above, it will be understood to those skilled in the art that the embodiments described are by way of example only. Accordingly, the apparatus described herein should not be limited based on the described embodiments. Rather, the apparatus described herein should only be limited in light of the claims that follow when taken in conjunction with the above description and accompanying drawings.

What is claimed is:

1. A delay locked loop (DLL) circuit, comprising:

a phase detection unit configured to compare a phase of a reference clock signal with a phase of a feedback clock signal so as to generate a phase detection signal;

an update control apparatus configured to generate a valid interval signal and generate an update control signal by determining a difference between the number of first logical values and the number of second logical values of the phase detection signal in response to the reference clock signal; and a shift register configured to update a delay value supplied to a delay line according to the update control signal when the valid interval signal is enabled, wherein the update control apparatus is configured to determine a logical value of the phase detection signal every cycle of the reference clock signal and enable the valid interval signal when one of the number of first logical values and the number of second logical values exceeds the other by a predetermined number so as to output the phase detection signal as the update control signal.

2. The DLL circuit of claim 1, wherein the shift register is configured to update the delay value in response to the update control signal when the valid interval signal is enabled and enable an update flag signal after a completion of the update.

3. The DLL circuit of claim 2, wherein the update control apparatus is configured to disable the valid interval signal when the update flag signal is enabled.

4. The DLL circuit of claim 3, wherein the update control apparatus comprises:

a switching portion configured to selectively output the reference clock signal as one of a first counting control clock signal and a second counting control clock signal according to the phase detection signal;

a first counting portion configured to perform a counting operation in response to the first counting control clock signal and generate a first counting signal having one or more bits;

a second counting portion configured to perform a counting operation in response to the second counting control clock signal and generate a second counting signal having one or more bits; and an update control portion configured to compare logical values of a bit of the one or more bits of the first counting signal and a bit of the one or more bits of the second counting signal, generate the valid interval signal and the update control signal in response to the compared logical values and the phase detection signal, and disable the valid interval signal when the update flag signal is enabled.

5. The DLL circuit of claim 4, wherein each of the first counting portion and the second counting portion comprise an up-counter and the first counting signal and the second counting signal are initially set to different values.

6. The DLL circuit of claim 4, wherein the update control portion is configured to latch the phase detection signal in response to the reference clock signal, enable the valid interval signal when the logical value of the first counting signal and the logical value of the second counting signal are determined to be equal to each other, and output the latched phase detection signal as the update control signal.

7. The DLL circuit of claim 6, wherein the update control portion comprises:

a logical value determination section configured to generate a logical value determination signal by comparing logical values of each bit of the one or more bits of each of the first counting signal and the second counting signal;

a first latch section configured to latch the phase detection signal in response to the reference clock signal and re-latch the latched phase detection signal in response to the logical value determination signal so as to output the update control signal; and a second latch section configured to latch an external supply voltage in response to the logical value determination signal so as to output the valid interval signal and disable the valid interval signal in response to the update flag signal.

8. The DLL circuit of claim 1, further comprising:

a clock input buffer configured to buffer an external clock signal so as to generate the reference clock signal and transmit the reference clock signal to the delay line;

a clock driver configured to generate an internal clock signal by driving a clock signal output from the delay line; and a delay compensating unit configured to generate the feedback clock signal by delaying the clock signal output from the delay line with a delay value acquired by modeling a delay value by delay elements provided on an output path of the delay clock signal.

9. An update control apparatus in a delay locked loop (DLL) circuit, comprising:

a switching portion configured to selectively output a reference clock signal as one of a first counting control clock signal and a second counting control clock signal according to a phase detection signal;

a first counting portion configured to perform a counting operation in response to the first counting control clock signal and generate a first counting signal having one or more bits;

a second counting portion configured to perform the counting operation in response to the second counting control clock signal and generate a second counting signal having one or more bits; and an update control portion configured to compare logical values of a bit of the one or more bits of the first counting signal and a bit of the one or more bits of the second counting signal and generate an update control signal according to the compared logical values and the phase detection signal.

10. The update control apparatus of claim 9, wherein each of the first counting portion and the second counting portion is implemented comprises an up-counter and the first counting signal and the second counting signal are initially set to different values.

11. The update control apparatus of claim 9, wherein the update control portion is configured to latch the phase detection signal in response to the reference clock signal and output the latched phase detection signal as the update control signal when it is determined that each of the logical value of the first counting signal and the logical value of the second counting signal are the same.

12. The update control apparatus of claim 11, wherein the update control portion comprises:

a logical value determination section configured to generate a logical value determination signal by comparing logical values of each bit of the one or more bits of each of the first counting signal and the second counting signal; and a latch section configured to latch the phase detection signal in response to the reference clock signal and re-latch the latched phase detection signal in response to the logical value determination signal so as to output the update control signal.

13. An update method of a delay locked loop (DLL) circuit, comprising:

generating a phase detection signal by comparing a phase of a reference clock signal and a phase of a feedback clock signal;

enabling a valid interval signal when a difference between the number of times a logical value of the phase detection signal has a first logical value and the number of times the logical value of the phase detection signal has a second logical value is equal to or exceeds a predetermined number;

updating a delay value which a delay line supplies to the reference clock signal in response to the valid interval signal; and disabling the valid interval signal when updating the delay value is completed.

14. The update method of claim 13, wherein enabling the valid interval signal comprises:

determining the logical value of the phase detection signal for every cycle of the reference clock signal; and enabling the valid interval signal when one of the number of times of the logical value has the first logical value and the number of times of the logical value has the second logical value exceeds the other by a predetermined number.

15. The update method of claim 14, wherein enabling the valid interval signal comprises:

selectively outputting the reference clock signal as one of a first counting control clock signal and a second counting control clock signal according to the phase detection signal;

generating a first counting signal having a plurality of bits by performing a counting operation in response to the first counting control clock signal and generating a second counting signal having a plurality of bits by performing a counting operation in response to the second counting control clock signal; and comparing logical values of each bit of the first counting signal and corresponding bits the second counting signal and generating the valid interval signal in response to the compared logical values and the phase detection signal.

16. The update method of claim 13, further comprising:

before generating the phase detection signal, generating the reference clock signal by buffering an external clock signal and transmitting the reference clock signal to the delay line; and generating the feedback clock signal by delaying a clock signal output from the delay line with a delay value acquired by modeling a delay value by delay elements that are provided on an output path of the clock signal output from the delay line.

* * * * *